United States Patent
Ma et al.

(10) Patent No.: US 9,641,316 B2
(45) Date of Patent: May 2, 2017

(54) FREQUENCY DIVIDER AND RADIO COMMUNICATIONS DEVICE

(71) Applicant: Huawei Technologies Co., Ltd., Shenzhen (CN)

(72) Inventors: Zhaoxin Ma, Shanghai (CN); Nianyong Zhu, Shanghai (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 277 days.

(21) Appl. No.: 14/677,459

(22) Filed: Apr. 2, 2015

(65) Prior Publication Data

US 2015/0295665 A1    Oct. 15, 2015

(30) Foreign Application Priority Data

Apr. 11, 2014 (CN) .......................... 2014 1 0143518

(51) Int. Cl.
| | |
|---|---|
| H03K 21/00 | (2006.01) |
| H03K 23/00 | (2006.01) |
| H03K 25/00 | (2006.01) |
| H04L 7/033 | (2006.01) |
| G06F 1/02 | (2006.01) |
| H03K 21/10 | (2006.01) |
| H03K 23/66 | (2006.01) |
| H03L 7/16 | (2006.01) |

(52) U.S. Cl.
CPC .............. *H04L 7/033* (2013.01); *G06F 1/022* (2013.01); *H03K 21/10* (2013.01); *H03K 23/667* (2013.01); *H03L 7/16* (2013.01)

(58) Field of Classification Search
CPC .. H03K 23/68; H03K 23/667; H03K 5/00006; G06F 7/68; G06F 1/08
USPC .................................................. 327/115, 117
See application file for complete search history.

(56) References Cited

U.S. PATENT DOCUMENTS

| | | | |
|---|---|---|---|
| 6,115,443 A * | 9/2000 | Wu .......................... | G06G 7/62 327/115 |
| 6,356,123 B1 | 3/2002 | Lee et al. | |

(Continued)

FOREIGN PATENT DOCUMENTS

| | | |
|---|---|---|
| CN | 1655457 A | 8/2005 |
| CN | 102468849 A | 5/2012 |

(Continued)

*Primary Examiner* — Quan Tra
(74) *Attorney, Agent, or Firm* — Leydig, Voit & Mayer, Ltd.

(57) ABSTRACT

Embodiments of the present invention disclose a frequency divider and a radio communications device. The frequency divider includes a shift register unit and an output frequency synthesizing unit; the shift register unit includes multiple cyclically cascaded basic units; a basic unit at each level includes $2^N$ D flip-flops connected in series and a multiplexer, outputs of the $2^N$ D flip-flops connected in series are separately connected to the multiplexer; an output of the multiplexer is connected to an input of a next-level basic unit; the output frequency synthesizing unit superposes an output signal of the first D flip-flop of the basic unit at each level to generate a frequency division output signal.

12 Claims, 5 Drawing Sheets

(56) References Cited

U.S. PATENT DOCUMENTS

| | | | | |
|---|---|---|---|---|
| 6,879,654 B2* | 4/2005 | Austin | .................. | H03K 23/68 |
| | | | | 377/122 |
| 7,940,132 B2* | 5/2011 | May | ........................ | G06F 1/06 |
| | | | | 327/115 |
| 8,542,040 B1* | 9/2013 | O'Day | .................. | H03K 23/00 |
| | | | | 327/115 |
| 2004/0213369 A1 | 10/2004 | Austin | | |
| 2005/0174153 A1 | 8/2005 | Saeki | | |
| 2009/0289671 A1 | 11/2009 | Lin | | |
| 2012/0112806 A1 | 5/2012 | Dayi | | |
| 2014/0185736 A1* | 7/2014 | Chandrashekar | .... | H03K 21/026 |
| | | | | 377/48 |

FOREIGN PATENT DOCUMENTS

| | | |
|---|---|---|
| WO | WO 2011028157 A1 | 3/2011 |
| WO | WO2013048525 A1 | 4/2013 |

\* cited by examiner

FREQUENCY DIVIDER AND RADIO COMMUNICATIONS DEVICE

CROSS-REFERENCE TO RELATED APPLICATIONS

This application claims priority to Chinese Patent Application No. 201410143518.0, filed on Apr. 11, 2014, which is hereby incorporated by reference in its entirety.

TECHNICAL FIELD

The present invention relates to the field of communications technologies, and in particular, to a frequency divider and a radio communications device.

BACKGROUND

Figure 1:
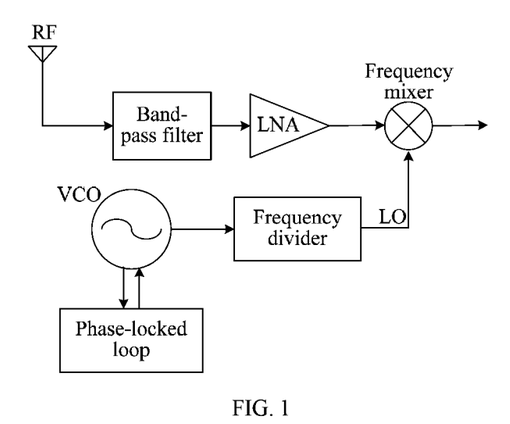
FIG. 1 is a schematic diagram of a transceiver circuit of a radio frequency communications system.

In a transceiver (Transceiver, TRX) circuit of a radio frequency communications system, as shown in FIG. 1, a received RF signal is filtered by a band-pass filter to remove out-of-band interference, and then is amplified by a low noise amplifier (Low Noise Amplifier, LNA) to reduce an impact of noise of a next-level circuit, and then is sent to an input end of a frequency mixer to be mixed with a local oscillator (Local Oscillator, LO) signal. Therefore, a stable LO signal is needed to be used as a reference signal for a transceiver link. The signal is obtained by dividing frequency of an output of a voltage-controlled oscillator (Voltage-Controlled Oscillator, VCO). In order to generate a precise and stable frequency at an output end of the VCO, generally, a phase-locked loop is further used to drive the VCO in a feedback loop, so that an oscillator frequency (or phase) precisely follows an applied reference frequency. With the development of integrated circuit technologies, more and more people tend to use digital logic to implement a frequency division function. Due to features of the digital logic, currently, frequency division ratios of most frequency dividers are integers. This manner limits a frequency range of the LO or has a high requirement on a tuning range of the VCO, which is disadvantageous to implementation of multimode on a same chip. A frequency divider having a non-integer frequency division ratio not only can provide more diverse frequency plans (frequency plan), so that the VCO can cover more communications modes by using a relatively narrow tuning range, but also can stagger an oscillating frequency of the VCO and a high-power harmonic wave of a power amplifier (Power Amplifier, PA), so as to avoid a frequency pulling (frequency pulling) phenomenon.

However, in all existing technical solutions using non-integer frequency division ratios, the frequency division ratio configurability of a frequency divider is generally poor. For example, in the solution of the patent WO2011028157A1, only clock phase arrangement manners in several cases are given, and no dynamic adjustment method is provided. Therefore, the configurability is poor, and a logic circuit is highly complex, which is not suitable for high-frequency working. For another example, in the solution of the patent WO2013048525A1, multiple quadrature signals are input to separately drive corresponding divide-by-5 frequency dividers; pulse signals having a pulse width of one input signal period are generated, and after passing through a narrow pulse generator, the pulse signals are combined together and output as a final signal. In this solution, multiple frequency dividers are completely independent of each other and consume a lot of resources, which is disadvantageous to implementation of low power consumption and low noise. Moreover, multiple frequency dividers start strictly following a required sequence, and therefore, a corresponding start circuit is needed; a sequence of the start circuit is closely related to a frequency division ratio, which does not facilitate to achieve configurability.

SUMMARY

Embodiments of the present invention provide a frequency divider and a radio communications device, which have simple structures, and are suitable for high-frequency working, easy to extend, and highly configurable.

According to a first aspect, an embodiment of the present invention provides a frequency divider, including a shift register unit and an output frequency synthesizing unit;

the shift register unit includes multiple cyclically cascaded basic units; a basic unit at each level includes $2^N$ D flip-flops connected in series and a multiplexer, and outputs of the $2^N$ D flip-flops connected in series are separately connected to the multiplexer; an output of the multiplexer is selected by using a gating signal and is connected to an input of a next-level basic unit; multiple clock signals having a same clock period but different phases are separately connected to clock signal input ends of multiple D flip-flops in the shift register unit are separately connected to multiple clock signals having a same clock period but different phases; a phase of a clock signal connected to the other $2^N-1$ D flip-flops except the first D flip-flop at a signal input end of the basic unit at each level lags behind a phase of a clock signal connected to the first D flip-flop by M/2 clock periods; a phase of a clock signal connected to the first D flip-flop of the next-level basic unit lags behind a phase of a clock signal connected to the other $2^N-1$ D flip-flops except the first D flip-flop in a previous-level basic unit by a ¾ clock period; M is a positive integer; a phase relationship between clock signals connected to D flip-flops in the previous-level basic unit and clock signals connected to D flip-flops in the next-level basic unit is controlled by a switch signal; and the output frequency synthesizing unit is configured to superpose an output signal of the first D flip-flop at the signal input end of the basic unit at each level to generate a frequency division output signal; an input signal of the first D flip-flop of a first-level basic unit is a frequency division input signal; a frequency division ratio of the frequency division output signal is n+x, where x is a fractional part of the frequency division ratio, and an output of x is controlled to be 0.25 or 0.75 according to the switch signal; n is an integer part of the frequency division ratio, is equal to a value of the gating signal, and is an integer greater than or equal to zero and less than N, and N is a positive integer.

In a first possible implementation manner, the frequency divider further includes: a clock adjustment unit, in response to the switch signal, configured to perform phase adjustment on input clock signals of quadrature phases and output the multiple clock signals, which have undergone phase adjustment and has a same clock period but different phases; and the switch signal is a digital signal, and is specifically a first value or a second value.

With reference to the first aspect or the first possible implementation manner of the first aspect, in a second possible implementation manner, when the switch signal is the first value, x is 0.25.

With reference to the first aspect or the second possible implementation manner of the first aspect, in a third possible implementation manner, M is 1.

With reference to the first aspect or the first possible implementation manner of the first aspect, in a fourth possible implementation manner, when the switch signal is the second value, x is 0.75.

With reference to the first aspect or the fourth possible implementation manner of the first aspect, in a fifth possible implementation manner, M is 2.

With reference to the first, the second, the third, the fourth, or the fifth possible implementation manner of the first aspect, in a sixth possible implementation manner, the shift register unit includes four cyclically cascaded basic units;

the clock adjustment unit is specifically configured to: perform processing on a received IP signal, QP signal, IN signal and QN signal, where the IP signal, QP signal, IN signal and QN signal are four clock signals having a same clock period but a phase difference of a ¼ clock period in sequence; and the clock adjustment unit specifically includes an I-path signal multiplexer, a Q-path signal multiplexer, and a time delay subunit;

the time delay subunit is specifically configured to: compensate for a time delay introduced by the I-path signal multiplexer and Q-path signal multiplexer, where after passing through the time delay subunit, the IP signal is connected to a clock signal input end of the first D flip-flop of the first-level basic unit;

the IP signal and the IN signal pass through the I-path signal multiplexer, and the I-path signal multiplexer chooses, according to the first value of the switch signal, to connect the IP signal to clock signal input ends of the other $2^N-1$ D flip-flops except the first D flip-flop of the first-level basic unit, and connect the IN signal to clock signal input ends of the other $2^N-1$ D flip-flops except the first D flip-flop of a third-level basic unit; or chooses, according to the second value of the switch signal, to connect the IN signal to clock signal input ends of the other $2^N-1$ D flip-flops except the first D flip-flop of the first-level basic unit, and connect the IP signal to clock signal input ends of the other $2^N-1$ D flip-flops except the first D flip-flop of a third-level basic unit;

after passing through the time delay subunit, the IN signal is connected to a clock signal input end of the first D flip-flop of the third-level basic unit;

after passing through the time delay subunit, the QN signal is connected to clock signal input ends of the other $2^N-1$ D flip-flops except the first D flip-flop of a second-level basic unit;

the QP signal and the QN signal pass through the Q-path signal multiplexer, and the Q-path signal multiplexer chooses, according to the first value of the switch signal, to connect the QN signal to a clock signal input end of the first D flip-flop of the second-level basic unit, and connect the QP signal to a clock signal input end of the first D flip-flop of a fourth-level basic unit; or chooses, according to the second value of the switch signal, to connect the QP signal to a clock signal input end of the first D flip-flop of the second-level basic unit, and connect the QN signal to a clock signal input end of the first D flip-flop of a fourth-level basic unit; and after passing through the time delay subunit, the QP signal is connected to clock signal input ends of the other $2^N-1$ D flip-flops except the first D flip-flop of the fourth-level basic unit.

With reference to the first aspect or the first, the second, the third, the fourth, the fifth, or the sixth possible implementation manner of the first aspect, in a seventh possible implementation manner, the output frequency synthesizing unit is specifically an OR logic circuit.

With reference to the first aspect or the first, the second, the third, the fourth, the fifth, the sixth, or the seventh possible implementation manner of the first aspect, in an eighth possible implementation manner, the output frequency synthesizing unit includes multiple levels of output adjustment circuits and an OR gate;

each level of output adjustment circuit is configured to perform an AND operation on an inverted signal of a clock signal of the first D flip-flop of the basic unit at each level and an output signal of the first D flip-flop to generate an output adjustment signal; and the output adjustment signal generated by each level of output adjustment circuit is superposed by using the OR gate to generate the frequency division output signal.

With reference to the first aspect or the first, the second, the third, the fourth, the fifth, the sixth, the seventh, or the eighth possible implementation manner of the first aspect, in a ninth possible implementation manner, the first D flip-flop of the first-level basic unit outputs a digital high level when a reset signal is valid, and the other D flip-flops except the first D flip-flop of the first-level basic unit in the frequency divider output a digital low level when the reset signal is valid.

With reference to the first aspect or the first, the second, the third, the fourth, the fifth, the sixth, the seventh, the eighth, or the ninth possible implementation manner of the first aspect, in a tenth possible implementation manner, N=1.

According to a second aspect, an embodiment of the present invention provides a radio communications device, including:

an antenna, configured to receive or send a radio frequency signal;

a frequency mixer, configured to perform frequency mixing on a baseband signal by using a local oscillator signal to generate the sent radio frequency signal, or perform frequency mixing on the received radio frequency signal by using a local oscillator signal to generate a baseband signal;

the frequency divider according to the first aspect, where the frequency divider is configured to provide the frequency division output signal to the frequency mixer as the local oscillator signal; and a phase-locked loop, configured to provide the frequency division input signal to the frequency divider.

According to the frequency divider and the radio communications device provided in the embodiments of the present invention, a shift register unit having a cyclic cascading structure including multiple basic units connected in series is used; an output signal of the first D flip-flop at a signal input end of the basic unit at each level is superposed to generate a frequency division output signal, and a phase difference of clock signals of D flip-flops in the basic unit at each level is precisely controlled, so as to implement non-integer frequency division having a frequency division ratio of 0.75 to n.75, and a step width of 0.5. The frequency divider provided in the embodiments of the present invention can be applied in a TRX circuit, has a simple structure, and is suitable for high-frequency working, easy to extend, and highly configurable.

The following further describes technical solutions of the embodiments of the present invention in detail by using accompanying drawings and embodiments.

DESCRIPTION OF EMBODIMENTS

The following describes the embodiments of the present invention in detail with reference to accompanying drawings. It should be clear that the described embodiments are merely a part rather than all of the embodiments of the present invention. All other embodiments obtained by a person of ordinary skill in the art based on the embodiments of the present invention without creative efforts shall fall within the protection scope of the present invention.

Figure 2:
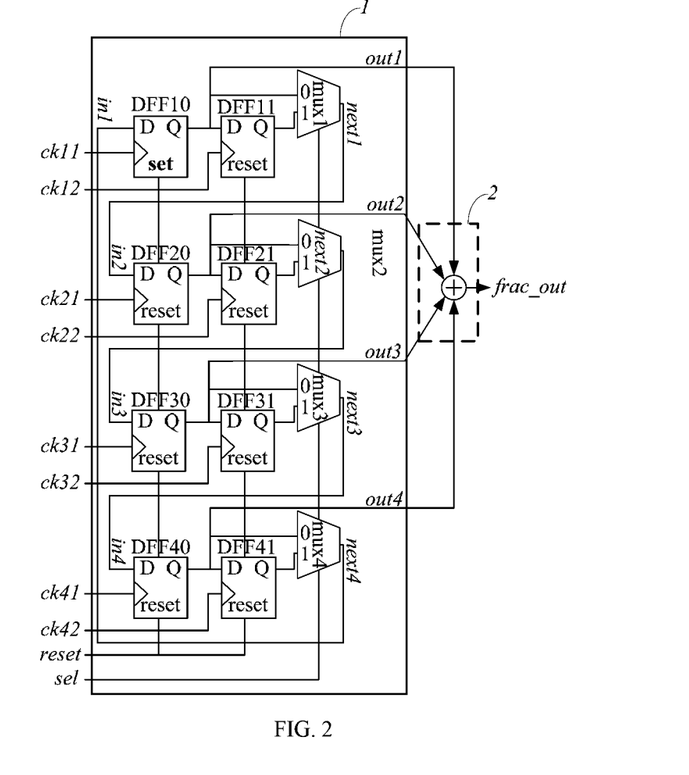
FIG. 2 is a circuit diagram of a frequency divider according to an embodiment of the present invention.

FIG. 2 shows a frequency divider provided in an embodiment of the present invention, including a shift register unit 1 and an output frequency synthesizing unit 2.

The shift register unit 1 has a cyclic cascading structure including multiple basic units connected in series. For a circuit structure of the basic unit, reference may be made to FIG. 3. A basic unit at each level includes $2^N$ D flip-flops (DFF) connected in series and one multiplexer (mux). The $2^N$ D flip-flops connected in series separately use DFF1, DFF ($2^N$–1). Outputs of the $2^N$ D flip-flops are separately connected to inputs 0, . . . , $2^N$–1 of the multiplexer mux. An output next of the multiplexer mux is selected by using a gating signal sel<N–1:0> of the multiplexer mux, and is connected to an input of a next-level basic unit. Herein, in represents an input signal of the basic unit, clk1 and clk2 each represent a clock signal, and reset represents a reset signal of the D flip-flop. For each D flip-flop, an input end is a D end, and an output end is a Q end. An input signal of the first D flip-flop of a first-level basic unit is a frequency division input signal.

Multiple clock signals having different phases are separately connected to clock signal input ends of multiple D flip-flops in the shift register unit 1. Specifically, a phase of a clock signal clk2 connected to the other $2^N$–1 D flip-flops except the first D flip-flop at a signal input end of the basic unit at each level lags behind a phase of a clock signal clk1 connected to the first D flip-flop by M/2 clock periods, a clock phase of the first D flip-flop in the $2^N$–1 D flip-flops lags behind the first D flip-flop at a signal input end of the basic unit at a same level by one clock period or a ½ clock period, and a clock phase of each of the other $2^N$–1 D flip-flops except the first D flip-flop in the $2^N$–1 D flip-flops lags behind a clock phase of a previous D flip-flop by one clock period. A phase of a clock signal connected to the first D flip-flop of the next-level basic unit lags behind a phase of a clock signal connected to the other $2^N$–1 D flip-flops except the first D flip-flop in a previous-level basic unit by a ¾ clock period; both M and N are positive integers.

The output frequency synthesizing unit 2 is configured to superpose an output signal of the first D flip-flop at the signal input end of the basic unit at each level to generate a frequency division output signal frac_out.

This embodiment is only described by using a case in which the basic unit at each level includes two D flip-flops connected in series and one 2-to-1 multiplexer as an example; this case can be easily generalized to other cases in which multiple D flip-flops are connected in series, and this case is only used as an example. A detailed description is provided in the following by using a specific circuit shown in FIG. 2 as an example, where each basic unit includes two D flip-flops and one 2-to-1 multiplexer. Because input clock signals in the present invention are clock signals of quadrature phases, in this embodiment of the present invention, the shift register unit 1 of the frequency divider is implemented by cascading basic units at four levels.

For ease of description, it is defined that in a first-level basic unit, the first D flip-flop is a DFF10, the second D flip-flop is a DFF11, and the multiplexer is mux1; in a second-level basic unit, the first D flip-flop is a DFF20, the second D flip-flop is a DFF21, and the multiplexer is mux2; in a third-level basic unit, the first D flip-flop is a DFF30, the second D flip-flop is a DFF31, and the multiplexer is mux3; and in the fourth-level basic unit, the first D flip-flop is a DFF40, the second D flip-flop is a DFF41, and the multiplexer is mux4.

In this embodiment of the present invention, a specific structure of the frequency divider shown in FIG. 2 is as follows:

The DFF10 receives a data input signal in1, and outputs an output signal out1 of the first-level basic unit after sampling the data input signal in1 by using ck11. The output signal out1 is also used as an input signal of the DFF11; an output is generated after the out1 is sampled by using a clock signal ck12 of the DFF11; this output and the out1 are separately connected to mux1. A signal next1 is selected as an output by using a gating signal sel of mux1 and is used as an input signal in2 of the second-level basic unit. The DFF20 receives the data input signal in2, and outputs an output signal out2 of the second-level basic unit after sampling the data input signal in2 by using ck21. The output signal out2 is also used as an input signal of the DFF21; an output is generated after the out2 is sampled by using a clock signal ck22 of the DFF21; this output and the out2 are separately connected to mux2. A signal next2 is selected as an output by using a gating signal sel of mux2, and is used as an input signal in3 of the third-level basic unit. The DFF30 receives the d ata input signal in3, and outputs an output signal out3 of the third-level basic unit after sampling the data input signal in3 by using ck31. The output signal out3 is also used as an input signal of the DFF31; an output is generated after the out3 is sampled by using a clock signal ck32 of the DFF31; this output and the out3 are separately connected to mux3. A signal next3 is selected as an output by using a gating signal sel of mux3, and is used as an input signal in4 of the fourth-level basic unit. The DFF40 receives the data input signal in4, and outputs an output signal out4 of the fourth-level basic unit after sampling the data input signal in4 by using ck41. The output signal out4 is also used as an input signal of the DFF41; an output is generated after the out4 is sampled by using a clock signal ck42 of the DFF41; this output and out4 are separately connected to mux4; a signal next4 is selected as an output by using a gating signal sel of mux4, and is used as the input signal in1 of the first-level basic unit. In this way, the cyclic cascading structure including multiple basic units connected in series is formed. The gating signals of mux1, mux2, mux3, and mux4 are the same gating signal sel. The output frequency synthesizing unit 2 superposes the output signals out1, out2, out3, and out4 of the basic units at four levels to generate the frequency division output signal frac_out.

The shift register unit 1 is a shift register driven by a multiphase clock, and each basic unit has an output delay function for an input signal. Specifically, a description is provided by using a structure of a basic unit given in FIG. 4 as an example.

Figure 4:
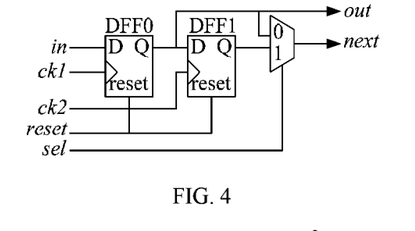
FIG. 4 is a circuit diagram of a basic unit in a frequency divider according to an embodiment of the present invention.

Assuming that a phase of a clock that generates an input signal, namely, a signal in, of the basic unit at this level is $\phi_0$, and a phase of a first clock signal ck1 used to drive the first D flip-flop DFF0 in the basic unit at this level and a phase of a second clock signal ck2 used to drive subsequent $2^N-1$ D flip-flops in the basic unit at this level are $\phi_1$ and $\phi_2$ respectively, a time delay that the basic unit generates for the input signal is:

$$T_{delay} = \begin{cases} \varphi_1 - \varphi_0 & sel = 0 \\ (\varphi_1 - \varphi_0) + (\varphi_2 - \varphi_1) & sel = 1 \end{cases} \quad \text{(Equation 1)}$$

In this embodiment, when a reset signal reset received by the foregoing registers DFF10 to DFF41 is a valid reset signal, except the DFF10 in the first-level basic unit, all other registers are reset and output a digital low level, while the DFF10 generates a positive pulse with a pulse width of T (T is a clock period of the input clock ck11). After the signal reset becomes invalid, a positive pulse with a pulse width of T is transferred in a loop including the basic units at all levels of the shift register unit 1, and a period of the positive pulse is $4T_{delay}$. If input clocks of the basic units at all levels are symmetric, intervals between the signals out1, out2, out3, and out4 are equal, and are added together as a period $T_{delay}$ of the final output frac_out.

In this embodiment of the present invention, a frequency division ratio of the frequency division output signal is n+x, where x is a fractional part of the frequency division ratio, and an output of x is controlled to be 0.25 or 0.75 according to a switch signal, n is an integer part of the frequency division ratio, is equal to a value of the gating signal, and is an integer greater than or equal to zero and less than N, and N is a positive integer.

The frequency divider provided in this embodiment of the present invention, before the shift register unit 1, may further include a clock adjustment unit 3, configured to generate clock signals to which the clock signal input ends of the multiple D flip-flops in the foregoing shift register unit 1 are required to be connected. This embodiment provides a specific circuit implementation manner of a clock adjustment unit, which is specifically shown in FIG. 5. Definitely, these clock signals may also be generated by using specific circuits of clock adjustment units in other forms.

Figure 5:
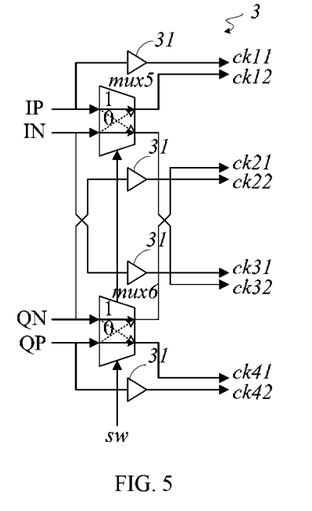
FIG. 5 is a circuit diagram of a clock adjustment unit in a frequency divider according to an embodiment of the present invention.

As shown in FIG. 5, the clock adjustment unit 3 includes an I-path signal multiplexer mux5, a Q-path signal multiplexer mux6, and a time delay subunit 31; the clock adjustment unit 3 uses quadrature signals as an input, and performs processing on a received IP signal, QP signal, IN signal and QN signal; and the IP signal, QP signal, IN signal and QN signal are four clock signals whose phases lag behind one another by a ¼ clock period in sequence.

Specifically, after the IP signal passes through the time delay subunit 31, ck11 is generated.

The IP signal and the IN signal pass through the I-path signal multiplexer mux5, and according to a switch signal sw, an IP signal ck12 and an IN signal ck32 are selectively output, or an IN signal ck32 or an IP signal ck12 is selectively output.

After the IN signal passes through the time delay subunit 31, ck31 is generated.

After the QN signal passes through the time delay subunit 31, ck22 is generated.

The QP signal and the QN signal pass through the Q-path signal multiplexer mux6, and according to the switch signal sw, a QN signal ck21 and a QP signal ck41 are selectively output, or a QN signal ck41 and a QP signal ck21 are selectively output.

After the QP signal passes through the delay subunit 31, ck42 is generated.

Specifically, a relationship between a clock signal output by the clock adjustment unit 3 and a signal sw is shown in the following table.

TABLE 1

|  | ck11 | ck12 | ck21 | ck22 | ck31 | ck32 | ck41 | ck42 |
|---|---|---|---|---|---|---|---|---|
| sw = 0 | IP | IN | QP | QN | IN | IP | QN | QP |
| sw = 1 | IP | IP | QN | QN | IN | IN | QP | QP |

Because the IP signal, QP signal, IN signal and QN signal are four clock signals whose phases lag behind one another by a ¼ clock period in sequence, it can be seen from Table 1 that whether a switch signal is 0 or 1, a phase of a clock signal, which is output by the clock adjustment unit 3 to the first D flip-flop in a next-level basic unit in the shift register unit 1, lags behind a phase of a clock signal of the other $2^N-1$ D flip-flops except the first D flip-flop in a previous-level basic unit by ¾T. In this way, a sufficient margin can be provided for the multiplexer mux and a delay of a related path, so as to improve a working frequency of the circuit. In addition, in a basic unit at a same level, a phase of a clock signal of $2^N-1$ D flip-flops lags behind a phase of a clock signal of the first D flip-flop by ½T or 1T.

The output frequency synthesizing unit 2 may specifically be an OR gate, and a relationship between a signal delay of the frequency divider circuit shown in FIG. 2 in this embodiment of the present invention and the signals sw and sel is shown in the following table.

TABLE 2

| sel | sw | $T_{delay}$ |
|---|---|---|
| 0 | 0 | N/A |
| 0 | 1 | N/A |
| 1 | 0 | 1.25T |
| 1 | 1 | 1.75T |

Figure 6:
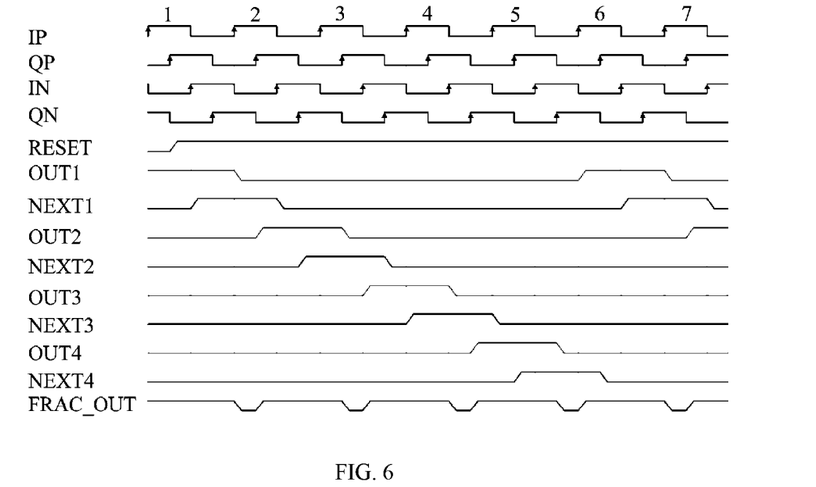
FIG. 6 is a sequence diagram of a frequency divider according to an embodiment of the present invention.
Figure 7:
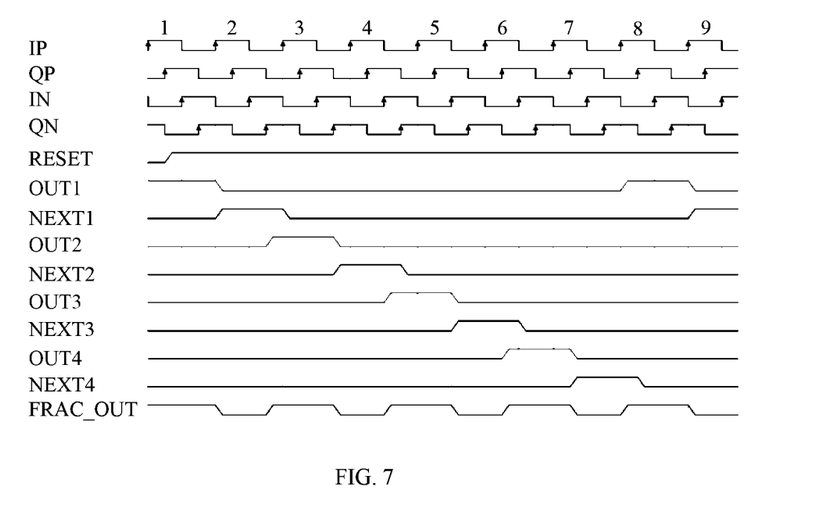
FIG. 7 is another sequence diagram of a frequency divider according to an embodiment of the present invention.

That is, when sel=1 and sw=0, a frequency division ratio of the frequency divider provided in this embodiment of the present invention is 1.25, and a sequence diagram of the circuit of the frequency divider is shown in FIG. 6; when sel=1 and sw=1, the frequency division ratio of the frequency divider provided in this embodiment of the present invention is 1.75, and a sequence diagram of the circuit of the frequency divider is shown in FIG. 7.

Figure 3:
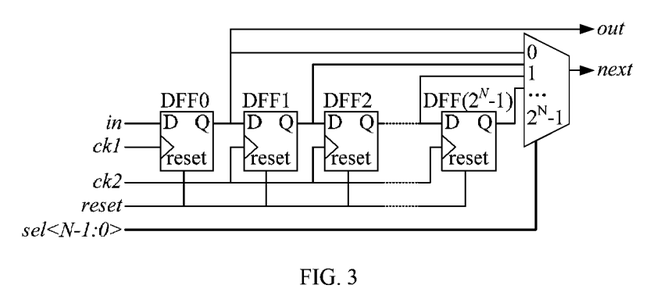
FIG. 3 is a circuit diagram of an extensible basic unit in a frequency divider according to an embodiment of the present invention.

If a basic unit form shown in FIG. 3 is used in the circuit of the frequency divider, the first clock signal ck1 output to the basic unit at each level is used to drive the first D flip-flop MITI in the basic unit at this level, and the second clock signal ck2 output to the basic unit at each level is used to drive subsequent $2^N-1$ D flip-flops; outputs of D flip-flops at each level are connected to inputs of a $2^N$-to-1 mux, and according to the signal sel, one of the outputs is selected as a signal next and output to a next-level basic unit. In this type of frequency divider circuit, if a simple OR gate is still used as the output frequency synthesizing unit 2, a relationship between a delay of the frequency divider circuit and the signals sw and sel is shown in the following table.

TABLE 3

| sel | sw | $T_{delay}$ |
|---|---|---|
| 0 | 0 | N/A |
| 0 | 1 | N/A |
| n | 0 | n.25T |
| n | 1 | n.75T |

When sel=0 and sw=1, $T_{delay}$ is unavailable, because a pulse width of out signals output at all levels is T, and an interval between two adjacent pulses is ¾T, and as a result, a simple OR gate cannot combine two adjacent pulses together.

Figure 8:
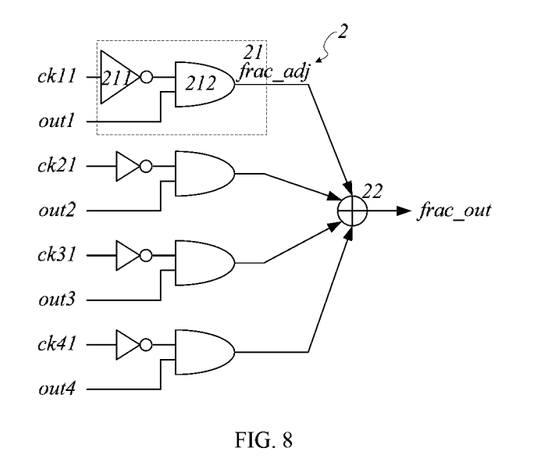
FIG. 8 is a circuit diagram of an output frequency synthesizing unit in a frequency divider according to an embodiment of the present invention.

In a specific example, a circuit structure, shown in FIG. 8, of an output frequency synthesizing unit of a frequency divider may be used.

Specifically, the output frequency synthesizing unit 2 includes multiple levels of output adjustment circuits 21 and an OR gate 22.

Each level of output adjustment circuit 21 specifically includes a phase inverter 211 and an AND gate 212. After the clock signal of the first D flip-flop in the basic unit at each level passes through the phase inverter 211, an AND operation is performed on the clock signal and an output signal of the first D flip-flop at this level to generate an output adjustment signal frac_adj of this level; and then the OR gate 22 is used to superpose the output adjustment signal frac_adj generated by each level of output adjustment circuit 21, to generate the frequency division output signal frac_out.

Figure 9:
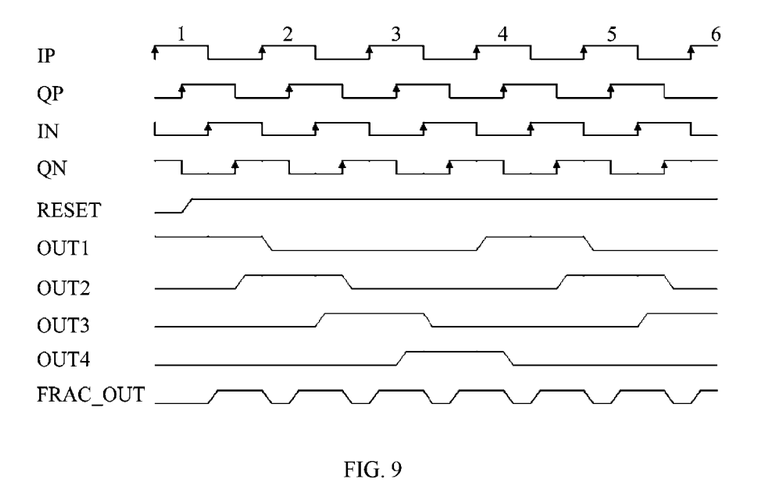
FIG. 9 is still another sequence diagram of a frequency divider according to an embodiment of the present invention.

In this way, when sel=0 and sw=1, frequency division having a frequency division ratio of 0.75 is implemented, and when sel=n and sw=1, frequency division having a frequency division ratio of n.75 is implemented. A sequence relationship is shown in FIG. 9.

This embodiment of the present invention provides a configurable non-integer frequency divider having a frequency division ratio of 0.75-n.75 and a step width of 0.5, which can be applied in a TRX circuit, has a simple structure, and is suitable for high-frequency working, easy to extend, and highly configurable.

Correspondingly, an embodiment of the present invention further provides a radio communications device, including an antenna, a frequency mixer, a frequency divider, and a phase-locked loop.

Specifically, the antenna is configured to receive or send a radio frequency signal.

The phase-locked loop is configured to provide the frequency division input signal to the frequency divider.

The frequency divider is specifically the frequency divider provided in the foregoing embodiment and is configured to provide the frequency division output signal to the frequency mixer as the local oscillator signal according to the frequency division input signal.

The frequency mixer is configured to perform frequency mixing on a baseband signal by using the local oscillator signal to generate the sent radio frequency signal, or perform frequency mixing on the received radio frequency signal by using the local oscillator signal to generate a baseband signal.

The radio communications device provided in this embodiment of the present invention uses the frequency divider provided in the foregoing embodiment to provide a local oscillator signal to a frequency mixer, can meet requirements of low noise, low power consumption and high frequency of a current radio frequency system, and can meet a flexible application requirement for a user.

A person skilled in the art may further realize that, units and algorithm steps of examples described with reference to the embodiments disclosed in this specification can be implemented by using electronic hardware, and composition and steps of the examples have been generally described according to functions in the foregoing description. A person skilled in the art may use different methods to implement the described functions for each particular application, but it should not be considered that the implementation goes beyond the scope of the embodiments of the present invention. Specifically, both the calculation and control part can be implemented by using logic hardware, which may be a logic integrated circuit made by using an integrated circuit technology, and is not limited in this embodiment.

Steps of methods or algorithms described in the embodiments disclosed in this specification may be implemented by hardware, a software module executed by a processor, or a combination thereof. The software module may reside in a random access memory (RAM), a memory, a read-only memory (ROM), an electrically programmable ROM, an electrically erasable programmable ROM, a register, a hard disk, a removable disk, a CD-ROM, or any other form of storage medium known in the art.

In the foregoing specific implementation manners, the objectives, technical solutions, and beneficial effects of the embodiments of the present invention are further described in detail. It should be understood that the foregoing descriptions are merely specific implementation manners of the embodiments of the present invention, but are not intended to limit the protection scope of the embodiments of present invention. Any modification, equivalent replacement, or improvement made without departing from the spirit and principle of the embodiments of the present invention shall fall within the protection scope of the embodiments of the present invention.

What is claimed is:

1. A frequency divider, comprising:
   an output frequency synthesizing unit; and
   a shift register unit comprising multiple cyclically cascaded basic units;
   wherein:
   a basic unit at each level of the shift register unit comprises $2^N$ D flip-flops connected in series and a multiplexer, and outputs of the $2^N$ D flip-flops connected in series are separately connected to the multiplexer;
   an output of the multiplexer is selected by using a gating signal and is connected to an input of a next-level basic unit;
   multiple clock signals having a same clock period but different phases are separately connected to clock signal input ends of multiple D flip-flops in the shift register unit, wherein a phase of a clock signal connected to the other $2^N-1$ D flip-flops except the first D flip-flop at a signal input end of the basic unit at each level lags behind a phase of a clock signal connected to the first D flip-flop by M/2 clock periods;

a phase of a clock signal connected to the first D flip-flop of the next-level basic unit lags behind a phase of a clock signal connected to the other $2^N-1$ D flip-flops except the first D flip-flop in a previous-level basic unit by a ¾ clock period;

M is a positive integer;

a phase relationship between clock signals connected to D flip-flops in the previous-level basic unit and clock signals connected to D flip-flops in the next-level basic unit is controlled by a switch signal; and the output frequency synthesizing unit is configured to superpose an output signal of the first D flip-flop at the signal input end of the basic unit at each level to generate a frequency division output signal;

an input signal of the first D flip-flop of a first-level basic unit is a frequency division input signal;

a frequency division ratio of the frequency division output signal is n+x, wherein x is a fractional part of the frequency division ratio, and an output of x is controlled to be 0.25 or 0.75 according to the switch signal; and n is an integer part of the frequency division ratio, is equal to a value of the gating signal, and is an integer greater than or equal to zero and less than N, and N is a positive integer.

2. The frequency divider according to claim 1, further comprising:

a clock adjustment unit, in response to the switch signal, configured to perform phase adjustment on input clock signals of quadrature phases, and output the multiple clock signals that have undergone phase adjustment and have a same clock period but different phases;

wherein the switch signal is a digital signal, and is a first value or a second value.

3. The frequency divider according to claim 2, wherein when the switch signal is the first value, x is 0.25.

4. The frequency divider according to claim 3, wherein M is 1.

5. The frequency divider according to claim 2, wherein when the switch signal is the second value, x is 0.75.

6. The frequency divider according to claim 5, wherein M is 2.

7. The frequency divider according to claim 2, wherein:

the shift register unit comprises four cyclically cascaded basic units;

the clock adjustment unit is configured to: perform processing on a received IP signal, QP signal, IN signal, and QN signal, wherein the IP signal, QP signal, IN signal, and QN signal are four clock signals having a same clock period but a phase difference of a ¼ clock period in sequence; and the clock adjustment unit comprises an I-path signal multiplexer, a Q-path signal multiplexer and a time delay subunit;

the time delay subunit is configured to: compensate for a time delay introduced by the I-path signal multiplexer and Q-path signal multiplexer, wherein after passing through the time delay subunit, the IP signal is connected to a clock signal input end of the first D flip-flop of the first-level basic unit;

the IP signal and the IN signal pass through the I-path signal multiplexer, and the I-path signal multiplexer chooses, according to the first value of the switch signal, to connect the IP signal to clock signal input ends of the other $2^N-1$ D flip-flops except the first D flip-flop of the first-level basic unit, and connect the IN signal to clock signal input ends of the other $2^N-1$ D flip-flops except the first D flip-flop of a third-level basic unit; or chooses, according to the second value of the switch signal, to connect the IN signal to clock signal input ends of the other $2^N-1$ D flip-flops except the first D flip-flop of the first-level basic unit, and connect the IP signal to clock signal input ends of the other $2^N-1$ D flip-flops except the first D flip-flop of a third-level basic unit;

after passing through the time delay subunit, the IN signal is connected to a clock signal input end of the first D flip-flop of the third-level basic unit;

after passing through the time delay subunit, the QN signal is connected to clock signal input ends of the other $2^N-1$ D flip-flops except the first D flip-flop of a second-level basic unit;

the QP signal and the QN signal pass through the Q-path signal multiplexer, and the Q-path signal multiplexer chooses, according to the first value of the switch signal, to connect the QN signal to a clock signal input end of the first D flip-flop of the second-level basic unit, and connect the QP signal to a clock signal input end of the first D flip-flop of a fourth-level basic unit; or chooses, according to the second value of the switch signal, to connect the QP signal to a clock signal input end of the first D flip-flop of the second-level basic unit, and connect the QN signal to a clock signal input end of the first D flip-flop of a fourth-level basic unit; and after passing through the time delay subunit, the QP signal is connected to clock signal input ends of the other $2^N-1$ D flip-flops except the first D flip-flop of the fourth-level basic unit.

8. The frequency divider according to claim 1, wherein the output frequency synthesizing unit is an OR logic circuit.

9. The frequency divider according to claim 1, wherein the output frequency synthesizing unit comprises multiple levels of output adjustment circuits and an OR gate;

each level of output adjustment circuit is configured to perform an AND operation on an inverted signal of a clock signal of the first D flip-flop of the basic unit at each level and an output signal of the first D flip-flop to generate an output adjustment signal; and the output adjustment signal generated by each level of output adjustment circuit is superposed by using the OR gate to generate the frequency division output signal.

10. The frequency divider according to claim 1, wherein the first D flip-flop of the first-level basic unit outputs a digital high level when a reset signal is valid, and the other D flip-flops except the first D flip-flop of the first-level basic unit in the frequency divider output a digital low level when the reset signal is valid.

11. The frequency divider according to claim 1 wherein N=1.

12. A radio communications device, comprising:

an antenna, configured to receive or send a radio frequency signal;

a frequency mixer, configured to perform frequency mixing on a baseband signal by using a local oscillator signal to generate a sent radio frequency signal, or perform frequency mixing on a received radio frequency signal by using a local oscillator signal to generate a baseband signal;

the frequency divider according to claim 1, wherein the frequency divider is configured to provide the frequency division output signal to the frequency mixer as the local oscillator signal; and a phase-locked loop, configured to provide the frequency division input signal to the frequency divider.

* * * * *